(12) United States Patent
Hadidi et al.

(10) Patent No.: US 10,987,735 B2
(45) Date of Patent: Apr. 27, 2021

(54) SPHEROIDAL TITANIUM METALLIC POWDERS WITH CUSTOM MICROSTRUCTURES

(71) Applicant: 6K Inc., North Andover, MA (US)

(72) Inventors: Kamal Hadidi, Somerville, MA (US); Gregory Wrobel, Boxford, MA (US); Makhlouf Redjdal, Stoneham, MA (US)

(73) Assignee: 6K Inc., North Andover, MA (US)

( * ) Notice: Subject to any disclaimer, the term of this patent is extended or adjusted under 35 U.S.C. 154(b) by 158 days.

(21) Appl. No.: 16/012,370

(22) Filed: Jun. 19, 2018

(65) Prior Publication Data

US 2018/0297122 A1 Oct. 18, 2018

Related U.S. Application Data

(63) Continuation-in-part of application No. 15/381,336, filed on Dec. 16, 2016.
(Continued)

(51) Int. Cl.
| | |
|---|---|
| *B22F 9/30* | (2006.01) |
| *H01J 37/32* | (2006.01) |
| *B22F 1/00* | (2006.01) |
| *B22F 9/08* | (2006.01) |
| *H05H 1/26* | (2006.01) |
| *H05H 1/30* | (2006.01) |

(Continued)

(52) U.S. Cl.
CPC ............ *B22F 9/30* (2013.01); *B22F 1/0003* (2013.01); *B22F 1/0048* (2013.01); *B22F 1/0085* (2013.01); *B22F 9/08* (2013.01); *B33Y 70/00* (2014.12); *H01J 37/32192* (2013.01); *H05H 1/26* (2013.01); *H05H 1/30* (2013.01); *H05H 1/42* (2013.01); *B22F 2207/11* (2013.01); *B22F 2998/10* (2013.01); *B22F 2999/00* (2013.01)

(58) Field of Classification Search
None
See application file for complete search history.

(56) References Cited

U.S. PATENT DOCUMENTS

| | | |
|---|---|---|
| 1,699,205 A | 1/1929 | Podszus et al. |
| 2,892,215 A | 6/1959 | Naeser et al. |
| (Continued) | | |

FOREIGN PATENT DOCUMENTS

| | | |
|---|---|---|
| CN | 101716686 A | 6/2010 |
| CN | 101716686 B | 6/2010 |
| (Continued) | | |

OTHER PUBLICATIONS

International Search Report and Written Opinion of the International Searching Authority relating to corresponding application No. PCT/IB2018/54523, completed on Oct. 22, 2018 and dated Nov. 2, 2018.

(Continued)

*Primary Examiner* — George Wyszomierski
(74) *Attorney, Agent, or Firm* — Knobbe Martens Olson & Bear LLP

(57) ABSTRACT

Methodologies, systems, and devices are provided for producing metal spheroidal powder products. By utilizing a microwave plasma, control over spheriodization and resulting microstructure can be tailored to meet desired demands.

24 Claims, 7 Drawing Sheets

Related U.S. Application Data

(60) Provisional application No. 62/268,186, filed on Dec. 16, 2015.

(51) Int. Cl.
*H05H 1/42* (2006.01)
*B33Y 70/00* (2020.01)

(56) References Cited

U.S. PATENT DOCUMENTS

| | | | |
|---|---|---|---|
| 3,293,334 A | 12/1966 | Bylund et al. | |
| 3,434,831 A | 3/1969 | Knopp et al. | |
| 3,466,165 A | 9/1969 | Rhys et al. | |
| RE26,879 E | 5/1970 | Kelso | |
| 3,652,259 A | 3/1972 | Knopp | |
| 3,802,816 A | 4/1974 | Kaufmann | |
| 3,966,374 A | 6/1976 | Honnorat et al. | |
| 4,076,640 A | 2/1978 | Forgensi et al. | |
| 4,177,026 A | 12/1979 | Honnorat et al. | |
| 4,423,303 A | 12/1983 | Hirose et al. | |
| 4,431,449 A | 2/1984 | Dillon et al. | |
| 4,569,823 A | 2/1986 | Westin | |
| 4,599,880 A | 7/1986 | Stepaneko et al. | |
| 4,670,047 A | 6/1987 | Kopatz et al. | |
| 4,705,560 A | 11/1987 | Kemp et al. | |
| 4,711,660 A | 12/1987 | Kemp et al. | |
| 4,711,661 A | 12/1987 | Kemp et al. | |
| 4,714,587 A * | 12/1987 | Eylon | C22C 1/0458 419/25 |
| 4,731,110 A | 3/1988 | Kopatz et al. | |
| 4,731,111 A | 3/1988 | Kopatz et al. | |
| 4,778,515 A | 10/1988 | Kemp et al. | |
| 4,780,131 A | 10/1988 | Kemp et al. | |
| 4,783,216 A | 11/1988 | Kemp et al. | |
| 4,783,218 A | 11/1988 | Kemp et al. | |
| 4,802,915 A | 2/1989 | Kopatz et al. | |
| 4,836,850 A | 6/1989 | Kemp et al. | |
| 4,923,509 A | 5/1990 | Kemp et al. | |
| 4,943,322 A | 7/1990 | Kemp et al. | |
| 4,952,389 A | 8/1990 | Szymanski et al. | |
| 5,095,048 A | 3/1992 | Takahashi et al. | |
| 5,200,595 A | 4/1993 | Boulos et al. | |
| 5,431,967 A | 7/1995 | Manthiram et al. | |
| 5,958,361 A | 9/1999 | Laine et al. | |
| 5,989,648 A | 11/1999 | Phillips | |
| 6,221,125 B1 | 4/2001 | Sode et al. | |
| 6,261,484 B1 | 7/2001 | Phillips et al. | |
| 6,274,110 B1 | 8/2001 | Kim et al. | |
| 6,334,882 B1 | 1/2002 | Aslund | |
| 6,409,851 B1 | 6/2002 | Sethuram et al. | |
| 6,543,380 B1 | 4/2003 | Sung-Spritzl | |
| 6,569,397 B1 | 5/2003 | Yadav et al. | |
| 6,589,311 B1 | 7/2003 | Han et al. | |
| 6,652,822 B2 | 11/2003 | Phillips et al. | |
| 6,676,728 B2 | 1/2004 | Han et al. | |
| 6,689,192 B1 | 2/2004 | Phillips et al. | |
| 6,755,886 B2 | 6/2004 | Phillips et al. | |
| 6,838,072 B1 | 1/2005 | Kong et al. | |
| 6,902,745 B2 | 6/2005 | Lee et al. | |
| 6,919,527 B2 | 7/2005 | Boulos et al. | |
| 7,066,980 B2 | 6/2006 | Akimoto et al. | |
| 7,108,733 B2 | 9/2006 | Enokido | |
| 7,125,537 B2 | 10/2006 | Liao et al. | |
| 7,175,786 B2 | 2/2007 | Celikkaya et al. | |
| 7,182,929 B1 | 2/2007 | Singhal et al. | |
| 7,220,398 B2 | 5/2007 | Sutorik et al. | |
| 7,297,310 B1 | 11/2007 | Peng et al. | |
| 7,357,910 B2 | 4/2008 | Phillips et al. | |
| 7,374,704 B2 | 5/2008 | Che et al. | |
| 7,431,750 B2 | 10/2008 | Liao et al. | |
| 7,517,513 B2 | 4/2009 | Sarkas et al. | |
| 7,524,353 B2 | 4/2009 | Johnson et al. | |
| 7,629,553 B2 | 12/2009 | Fanson et al. | |
| 7,700,152 B2 | 4/2010 | Laine et al. | |
| 7,931,836 B2 | 4/2011 | Xie et al. | |
| 8,043,405 B2 | 10/2011 | Johnson et al. | |
| 8,211,388 B2 | 7/2012 | Woodfield et al. | |
| 8,268,230 B2 | 9/2012 | Cherepy et al. | |
| 8,303,926 B1 | 11/2012 | Luhrs et al. | |
| 8,329,090 B2 | 12/2012 | Hollingsworth et al. | |
| 8,439,998 B2 | 5/2013 | Ito et al. | |
| 8,478,785 B2 | 7/2013 | Jamjoom et al. | |
| 8,748,785 B2 | 6/2014 | Jordan et al. | |
| 8,840,701 B2 | 9/2014 | Borland et al. | |
| 8,951,496 B2 | 2/2015 | Hadidi et al. | |
| 9,023,259 B2 | 5/2015 | Hadidi et al. | |
| 9,101,982 B2 | 8/2015 | Aslund | |
| 9,206,085 B2 | 12/2015 | Hadidi et al. | |
| 9,242,224 B2 | 1/2016 | Redjdal et al. | |
| 9,259,785 B2 | 2/2016 | Hadidi et al. | |
| 9,321,071 B2 | 4/2016 | Jordan et al. | |
| 9,421,612 B2 | 8/2016 | Fang et al. | |
| 9,630,162 B1 | 4/2017 | Sunkara et al. | |
| 9,643,891 B2 | 5/2017 | Hadidi et al. | |
| 9,782,791 B2 | 10/2017 | Redjdal et al. | |
| 9,782,828 B2 | 10/2017 | Wilkinson | |
| 9,796,019 B2 | 10/2017 | She et al. | |
| 9,796,020 B2 | 10/2017 | Aslund | |
| 9,945,034 B2 | 4/2018 | Yao et al. | |
| 9,999,922 B1 | 6/2018 | Struve | |
| 10,065,240 B2 | 9/2018 | Chen | |
| 10,130,994 B2 | 11/2018 | Fang et al. | |
| 10,350,680 B2 | 7/2019 | Yamamoto et al. | |
| 10,639,712 B2 | 5/2020 | Barnes et al. | |
| 2002/0112794 A1 | 8/2002 | Sethuram et al. | |
| 2003/0000773 A1 | 4/2003 | Strutt et al. | |
| 2003/0077398 A1 | 4/2003 | Strutt et al. | |
| 2003/0172772 A1 | 9/2003 | Sethuram et al. | |
| 2003/0196513 A1 | 10/2003 | Phillips | |
| 2004/0000091 A1 | 1/2004 | Philips et al. | |
| 2004/0009118 A1 | 1/2004 | Philllips et al. | |
| 2004/0022939 A1 | 2/2004 | Kim et al. | |
| 2004/0045807 A1 | 3/2004 | Sarkas et al. | |
| 2004/0123699 A1 | 7/2004 | Liao et al. | |
| 2004/0183008 A1 | 9/2004 | Wiseman | |
| 2005/0025698 A1 | 2/2005 | Talbot et al. | |
| 2005/0163696 A1 | 7/2005 | Uhm et al. | |
| 2005/0242070 A1 | 11/2005 | Hammer | |
| 2006/0145124 A1 | 7/2006 | Hsiao et al. | |
| 2007/0075052 A1 | 4/2007 | Fanson et al. | |
| 2007/0089860 A1 | 4/2007 | Hou et al. | |
| 2007/0130656 A1 | 6/2007 | Boulos et al. | |
| 2007/0259768 A1 | 11/2007 | Kear et al. | |
| 2008/0006954 A1 | 1/2008 | Yubuta et al. | |
| 2008/0173641 A1 | 7/2008 | Hadidi et al. | |
| 2009/0074655 A1 | 3/2009 | Suciu | |
| 2009/0093553 A1 | 4/2009 | Jager et al. | |
| 2009/0155689 A1 | 6/2009 | Zaghib et al. | |
| 2010/0086853 A1 | 4/2010 | Venkatachalam et al. | |
| 2010/0176524 A1 | 7/2010 | Burgess et al. | |
| 2012/0027955 A1 | 2/2012 | Sunkara et al. | |
| 2012/0077082 A1 | 3/2012 | Se-Hee et al. | |
| 2012/0272788 A1 | 11/2012 | Withers | |
| 2012/0294919 A1 | 11/2012 | Jaynes et al. | |
| 2012/0322645 A1 | 12/2012 | Jordan et al. | |
| 2013/0071284 A1 | 3/2013 | Kano | |
| 2013/0270261 A1 | 10/2013 | Hadidi et al. | |
| 2013/0284325 A1 | 10/2013 | Lee et al. | |
| 2013/0315773 A1 | 11/2013 | Moxson et al. | |
| 2014/0131906 A1 | 5/2014 | Hadidi et al. | |
| 2014/0155249 A1 | 6/2014 | Hadidi et al. | |
| 2014/0202286 A1 | 7/2014 | Yokoyama et al. | |
| 2014/0217630 A1 | 8/2014 | Redjdal et al. | |
| 2014/0287162 A1 | 9/2014 | Jordan et al. | |
| 2014/0328724 A1 | 11/2014 | Chen | |
| 2014/0373344 A1 | 12/2014 | Takada et al. | |
| 2017/0113273 A1 | 4/2017 | Fang et al. | |
| 2017/0120339 A1 | 5/2017 | Aslund | |
| 2017/0151609 A1 | 6/2017 | Elsen et al. | |
| 2017/0173699 A1 | 6/2017 | Hadidi et al. | |
| 2017/0209908 A1 | 7/2017 | Smathers et al. | |
| 2017/0209963 A1 | 7/2017 | Smathers et al. | |
| 2017/0252854 A1 | 9/2017 | Maier et al. | |
| 2017/0368602 A1 | 12/2017 | She et al. | |

(56) References Cited

U.S. PATENT DOCUMENTS

| | | |
|---|---|---|
| 2017/0368604 A1 | 12/2017 | Wilkinson et al. |
| 2017/0373344 A1 | 12/2017 | Hadidi et al. |
| 2018/0126464 A1 | 5/2018 | Hadidi et al. |
| 2018/0297122 A1 | 10/2018 | Hadidi et al. |
| 2018/0301280 A1 | 10/2018 | Noshisaka et al. |
| 2018/0361500 A1 | 12/2018 | Aleksandrov et al. |
| 2019/0001416 A1 | 1/2019 | Larouche et al. |
| 2019/0217389 A1 | 7/2019 | Parrish et al. |
| 2019/0218650 A1* | 7/2019 | Subramanian ......... B33Y 80/00 |
| 2020/0203706 A1 | 6/2020 | Holman et al. |
| 2020/0215606 A1 | 7/2020 | Barnes et al. |

FOREIGN PATENT DOCUMENTS

| | | |
|---|---|---|
| CN | 102179521 B | 4/2011 |
| CN | 102554242 B | 2/2012 |
| CN | 104084592 A | 10/2014 |
| CN | 104209526 A | 12/2014 |
| CN | 104772473 B | 7/2015 |
| EP | 0256233 A2 | 2/1988 |
| EP | 3474978 A4 | 5/2019 |
| WO | WO 2011/082596 | 7/2011 |
| WO | WO 2015/174949 | 11/2015 |
| WO | WO 2016/048862 | 3/2016 |
| WO | WO 2017/106601 | 6/2017 |
| WO | WO 2017/106601 A1 | 6/2017 |
| WO | WO 2017/106601 A8 | 6/2017 |
| WO | WO 2017/177315 A1 | 10/2017 |
| WO | WO 2017/223482 | 12/2017 |
| WO | WO 2019/139773 | 7/2019 |
| WO | WO2019/139773 | 7/2019 |
| WO | WO 2019/243870 | 12/2019 |
| WO | WO 2019/246242 | 12/2019 |
| WO | WO 2019/246257 | 12/2019 |
| WO | WO 2020/132343 | 6/2020 |

OTHER PUBLICATIONS

Babajide Patrick Ajayi et al.: "A rapid and scalable method for making mixed metal oxide alloys for enabling accelerated materials discovery", Journal of Materials Research, vol. 31, No. 11, Mar. 28, 2016 (Mar. 28, 2016), pp. 1596-1607.

Boulos, M., "Induction Plasma Processing of Materials for Powders, Coating, and Near-Net-Shape Parts", Advanced Materials & Processes, Aug. 2011.

Carreon, H. et al., "Study of Aging Effects in a Ti—6Al—4V alloy with Widmanstatten and Equiaxed Microstructures by Nondestructive Means", AIP Conference Proceedings 1581, 739 (2014), Published online Feb. 17, 2015.

Chang, Shih-Min et al: "One-Step Fast Synthesis of Li4Ti5O12 Particles Using an Atmospheric Pressure Plasma Jet", Journal of The American Ceramic Society., vol. 97, No. 3, Dec. 26, 2013 (Dec. 26, 2013), pp. 708-712.

Dolbec, Richard, "Recycling Spherical Powders," Presented at Titanium 2015, Orlando, FL, Oct. 2015.

International Preliminary Report on Patentability and Written Opinion in PCT/US2019/037979 dated Aug. 22, 2019.

Nyutu, Edward K. et al.: "Ultrasonic Nozzle Spray in Situ Mixing and Microwave-Assisted Preparation of Nanocrystalline Spinel Metal Oxides: Nickel Ferrite and Zinc Aluminate", Journal of Physical Chemistry C, vol. 112, No. 5, Feb. 1, 2008 (Feb. 1, 2008), pp. 1407-1414.

Reig, L. et al., "Microstructure and Mechanical Behavior of Porous Ti—6Al—4V Processed by Spherical Powder Sintering", Materials, vol. 6, pp. 4868-4878, Published Oct. 23, 2013.

Sheng, Y. et. Al: "Preparation of Spherical Tungsten Powder by RF Induction Plasma," Rare Metal Materials and Engineering, vol. 40, No. 11, Nov. 2011, pp. 2033-2037.

Sheng, Y.et. Al: "Preparation of Micro-spherical Titanium Powder by RF Plasma," Rare Metal Materials and Engineering, vol. 42, No. 6, Jun. 2013, pp. 1291-1294.

Supplementary European Search Report for application No. 17816316.8 which in an EP application related to the present application, dated Jan. 22, 2020.

Wang, Jian-Jun et al: "Preparation of Spherical Tungsten and Titanium Powders by RF Induction Plasma Processing," Rare Metals, vol. 34, No. 6, May 31, 2014 (May 31, 2014), pp. 431-435.

Zhang , K., Ph.D. thesis entitled "The Microstructure and Properties of Hipped Powder Ti Alloys", University of Birmingham, College of Engineering and Physical Sciences, Apr. 2009.

International Preliminary Report on Patentability and Written Opinion of the International Searching Authority, completed on Feb. 9, 2017 and dated Mar. 22, 2017.

International Search Report and Written Opinion of the International Searching Authority relating to corresponding Application No. PCT/US17/39049, completed on Aug. 31, 2017 and dated Oct. 31, 2017.

Boulos, M. I., "The inductively coupled radio frequency plasma." Journal of High Temperature Material Process, 1997, vol. 1, pp. 17-39.

Ivasishin, et al., "Innovative Process for Manufacturing Hydrogenated Titanium Powder for Solid State Production of R/M Titanium Alloy Components" Titanium Oct. 3-6, 2010, 27 pages.

J. H. Van Laar et al, "Spheroidisation of Iron Powder in a Microwave Plasma Reactor", Journal of the Southern African Institute of Mining and Metallurgy, vol. 116, No. 10, pp. 941-946, Oct. 2016.

V. I. Kotlyarov et al, "Production of Spherical Powders on the Basis of Group IV Metals for Additive Manufacturing", Inorganic Materials: Applied Research, Pleiades Publishing, vol. 8, No. 3, pp. 452-458, May 2017.

Laine, R. M. et al., "Making nanosized oxide powders from precursors by flame spray pyrolysis." Key Engineering Materials (1999), v 159-160, p. 17-24.

Muoto, C. et al., "Phase Homogeneity in Y2O3-MgO Nanocomposites Synthesized by Thermal Decomposition of Nitrate Precursors with Ammonium Acetate Additions" J. Am. Ceram. Soc., 94[12] 4207-4217., 2011.

Veith et al., "Low temperature synthesis of nanocrystalline Y3Al5012 (YAG) and Cedoped Y3Al5012 via different sol-gel methods." J. Mater Chem, (1999) 9: 3069-3079.

Yang et al., "Preparation of Spherical Titanium Powders from Polygonal Titanium Hydride Powders by Radio Frequency Plasma Treatment" Materials Transactions, vol. 54, No. 12 (2013) pp. 2313 to 2316.

Suryanarayana, "Recent Developments in Mechanical alloying" Reviews on Advanced Materials Science 18(3):203-211. Aug. 2008.

Chikumba et al., "High Entropy Alloys: Development and Applications" 7th International Conference on Latest Trends in Engineering & Technology (ICLTET'2015) Nov. 26-27, 2015 Irene, Pretoria (South Africa).

Popescu et al.. "New TiZrNbTaFe high entropy alloy used for medical applications" IOP Conference Series: Materials Science and Engineering 400. Mod Tech 2018 (2018), 9 pages.

He et al., "A precipitation-hardened high-entropy alloy with outstanding tensile properties" Acta Materialia 102 (2016) pp. 187-196.

Chen, G. et al., "Spherical Ti-6Al-4V Powders Produced by Gas Atomization", Key Engineering Materials, vol. 704, Aug. 2016, pp. 287-292. URL: https://www.scientific.net/KEM.704.287.

Lin, M., "Gas Quenching with Air Products' Rapid Gas Quenching Gas Mixture", Air Products, Dec. 31, 2007, in 4 pages. URL: https://www.airproducts.co.uk/-/media/airproducts/files/en/330/330-07-085-us-gas-quenching-with-air-products-rapid-gas-quenching-gas-mixture.pdf.

Notification of Transmittal of the International Search Report and the Written Opinion of the International Searching Authority relating to PCT/US2016/067100 issued Feb. 9, 2017 and dated Mar. 22, 2017.

Notification of Transmittal of the International Search Report and Written Opinion of the International Searching Authority relating to PCT/US2019/037956 issued Sep. 24, 2019 and dated Oct. 1, 2019.

International Preliminary Report on Patentability and Written Opinion, re PCT Application No. PCT/US2019/037956, dated Dec. 30, 2020.

(56) References Cited

OTHER PUBLICATIONS

International Search Report and Written Opinion, re PCT Application No. PCT/US2019/037979, dated Aug. 22, 2019.

* cited by examiner

SPHEROIDAL TITANIUM METALLIC POWDERS WITH CUSTOM MICROSTRUCTURES

RELATED APPLICATIONS

This application is a continuation in part of U.S. patent application Ser. No. 15/381,336 (U.S. Patent Publication No. US 2017/0173699), which claims priority to and the benefit of U.S. Provisional Patent Application No. 62/268,186, filed Dec. 16, 2015. Each of the foregoing applications is incorporated herein by reference in its entirety.

TECHNICAL FIELD

The present disclosure is generally directed towards producing metal spheroidal powder products. More particularly, the present disclosure is directed towards techniques for producing metal spheroidal powder products (e.g., Ti powders, Ti alloy powders, Ti compound powders) using a microwave generated plasma.

BACKGROUND

An important aspect of preparing some forms of industrial powders is the spheroidization process, which transforms irregularly shaped or angular powders produced by conventional crushing methods, into spherical low-porosity particles. Spherical powders are homogenous in shape, denser, less porous, have a high and consistent flowability, and high tap density. Such powders exhibit superior properties in applications such as injection molding, thermal spray coatings, additive manufacturing, etc.

Creating spheroidal metallic powders, especially metallic powders containing Ti, can pose a number of challenges. Achieving the desired spheroidal shape, the desired level of porosity (e.g., no porosity to very porous, and the desired composition and microstructure can be difficult.

Conventional spheroidization methods employ thermal arc plasma described in U.S. Pat. No. 4,076,640 issued Feb. 28, 1978 and radio-frequency generated plasma described in U.S. Pat. No. 6,919,527 issued Jul. 19, 2005. However, these two methods present limitations inherent to the thermal non-uniformity of radio-frequency and thermal arc plasmas.

In the case of thermal arc plasma, an electric arc is produced between two electrodes generates a plasma within a plasma channel. The plasma is blown out of the plasma channel using plasma gas. Powder is injected from the side, either perpendicularly or at an angle, into the plasma plume, where it is melted by the high temperature of the plasma. Surface tension of the melt pulls it into a spherical shape, then it is cooled, solidified and is collected in filters. An issue with thermal arc plasma is that the electrodes used to ignite the plasma are exposed to the high temperature causing degradation of the electrodes, which contaminates the plasma plume and process material. In addition, thermal arc plasma plume inherently exhibit large temperature gradient. By injecting powder into the plasma plume from the side, not all powder particles are exposed to the same process temperature, resulting in a powder that is partially spheroidized, non-uniform, with non-homogeneous porosity.

In the case of radio-frequency inductively coupled plasma spheroidization, the plasma is produced by a varying magnetic field that induces an electric field in the plasma gas, which in turn drives the plasma processes such as ionization, excitation, etc. . . . to sustain the plasma in cylindrical dielectric tube. Inductively coupled plasmas are known to have low coupling efficiency of the radio frequency energy into the plasma and a lower plasma temperature compared to arc and microwave generated plasmas. The magnetic field responsible for generating the plasma exhibits a non-uniform profile, which leads to a plasma with a large temperature gradient, where the plasma takes a donut-like shape that exhibiting the highest temperature at the edge of the plasma (close to the dielectric tube walls) and the lowest temperature in the center of the donut. In addition, there is a capacitive component created between the plasma and the radio frequency coils that are wrapped around the dielectric tube due to the RF voltage on the coils. This capacitive component creates a large electric field that drives ions from the plasma towards the dielectric inner walls, which in turn leads to arcing and dielectric tube degradation and process material contamination by the tube's material.

To be useful in additive manufacturing or powdered metallurgy (PM) applications that require high powder flow, metal powder particles should exhibit a spherical shape, which can be achieved through the process of spheroidization. This process involves the melting of particles in a hot environment whereby surface tension of the liquid metal shapes each particle into a spherical geometry, followed by cooling and re-solidification. Also, spherical powders can be directly produced by various techniques. In one such technique, a plasma rotating electrode (PRP) produces high flowing and packing titanium and titanium alloy powders but is deemed too expensive. Also, spheroidized titanium and titanium alloys have been produced using gas atomization, which uses a relatively complicated set up an may introduce porosity to the powder. Spheroidization methods of irregular shape powders include TEKNA's (Sherbrook, Quebec, Canada) spheroidization process using inductively coupled plasma (ICP), where angular powder obtained from Hydride-Dehydride (HDH) process is entrained within a gas and injected though a hot plasma environment to melt the powder particles. However, this method suffers from non uniformity of the plasma, which leads to incomplete spheroidization of feedstock. The HDH process involves several complex steps, including hydrogenation dehydrogenation, and deoxidation before the powder is submitted to spheroidization. This process is a time consuming multi-step process, which drives up the cost of metal powders made through these methods.

From the discussion above, it is therefore seen that there exists a need in the art to overcome the deficiencies and limitations described herein and above.

SUMMARY

The shortcomings of the prior art are overcome and additional advantages are provided through the use of a microwave generated plasma torch and selecting and controlling cooling processing parameters to generate spheroidized metallic particles with a desired microstructure. Exemplary embodiments of the present technology are directed to spheroidal titanium (e.g., titanium and titanium alloy) particles and methods for preparing such particles.

In one aspect, the present disclosure relates to spheroidized particles including titanium. The spheroidized particles are prepared by a process including: introducing a titanium based feed material (e.g., feed material includes titanium, such as titanium particles or titanium alloy powders) including particles into a microwave plasma torch; melting and spheroidizing the feed material within a plasma generated by the microwave plasma torch; exposing the spheroidized particles to an inert gas; and setting one or more cooling processing variables to tailor the microstructure of the spheroidized particles including titanium. The above aspect includes one or more of the following features. In one embodiment, the titanium based feed material includes a titanium alloy. In another embodiment, the spheroidized particles are Ti Al6-V4 (i.e., Ti 6-4). In another embodiment, melting and spheroidizing of the feed material occurs within a substantially uniform temperature profile between about 4,000K and 8,000K. In another embodiment, the feed material has a particle size of no less than 1.0 micrometers and no more than 300 micrometers. In another embodiment, one or more cooling processing variables are set to create a martensitic microstructure in the spheroidized particles. In another embodiment, one or more cooling processing variables are set to create a Widmanstätten microstructure in the spheroidized particles. In another embodiment, one or more cooling processing variables are set to create an equiaxed microstructure in the spheroidized particles. In another embodiment, one or more cooling processing variables are set to create at least two regions, each region having a different microstructure. In another embodiment, the at least two regions include a core portion and a skin portion. In another embodiment, the skin portion has a microstructure that is different from the feed material's microstructure.

In another aspect, the present disclosure relates to a method of tailoring microstructure of spheroidized metallic particles. The method includes introducing a metal feed material including particles into a microwave plasma torch. The method also includes melting and spheroidizing the feed material within a plasma generated by the microwave plasma torch; exposing the spheroidized particles to an inert gas; and setting one or more cooling processing variables to tailor the microstructure of the spheroidized metallic particles. The above aspect includes one or more of the following features. In one embodiment, the metal feed material includes a titanium based feed material. In another embodiment, melting and spheroidizing of the feed material occurs within a substantially uniform temperature profile between about 4,000K and 8,000K. In another embodiment, the feed material has a particle size of no less than 1.0 micrometers and no more than 300 micrometers. In another embodiment, setting one or more cooling processing variables includes selecting and controlling a cooling gas flow rate. In another embodiment, setting one or more cooling processing variables includes selecting and controlling a residence time of the particles of feed materials within the plasma. In another embodiment, setting one or more cooling processing variables includes selecting and controlling a cooling gas composition. In another embodiment, the cooling gas composition is selected to provide high thermal conductivity. In another embodiment, one or more cooling processing variables are set to create a martensitic microstructure in the spheroidized particles. In another embodiment, one or more cooling processing variables are set to create a Widmanstätten microstructure in the spheroidized particles. In another embodiment, one or more cooling processing variables are set to create an equiaxed microstructure in the spheroidized particles. In another embodiment, one or more cooling processing variables are set to create at least two regions, each region having a different microstructure. In another embodiment, the at least two regions include a core portion and a skin portion. In another embodiment, the skin portion has a microstructure that is different from the feed material's microstructure.

In another aspect, the present disclosure relates to a method of modifying at least one of particle shape or microstructure of a titanium based feed stock. The method includes selecting a composition of the titanium based metal feed stock; determining a desired microstructure for a final product; selecting cooling process parameters based upon desired microstructure and composition of the titanium based metal feed stock; melting at least a surface portion of particles of the titanium based metal feed stock in a plasma having a substantially uniform temperature profile at between 4,000K and 8,000K to spheriodize the feed stock; exposing the spheroidized particles to an inert gas; and setting and applying the selected cooling processing parameters to create spheroidized particles with the desired microstructure. The above aspect includes one or more of the following features. In one embodiment, selecting the composition of the titanium based metal feed material includes determining an alloying composition of a titanium based feed stock source. In another embodiment, the particles of the titanium based metal feed stock have a particle size of no less than 1.0 micrometers and no more than 300 micrometers. In another embodiment, setting and applying the selected cooling processing parameters includes controlling a cooling gas flow rate. In another embodiment, setting and applying the selected cooling processing parameters include controlling a residence time of the particles of the titanium based metal feed stock in the plasma. In another embodiment, setting and applying the selected cooling processing parameters includes controlling a cooling gas composition. In another embodiment, the cooling gas composition is selected to provide high thermal conductivity. In another embodiment, the cooling processing parameters are selected to create a martensitic microstructure in the spheroidized particles. In another embodiment, the cooling processing parameters are selected to create a Widmanstätten microstructure in the spheroidized particles. In another embodiment, the cooling processing parameters are selected to create an equiaxed microstructure in the spheroidized particles. In another embodiment, the cooling processing parameters are selected to create at least two regions, each region having a different microstructure or crystal structure. The at least two regions can include a core portion and a skin portion. In another embodiment, the skin portion has a microstructure that is different from the feed stock's microstructure. In another embodiment, the titanium based metal feed stock has a α-phase crystal structure and the spheroidized particles includes one or more regions of a β-phase crystal structure. In another embodiment, the titanium based metal feed stock has a single phase structure and the spheroidized particles have a multiphase structure.

Embodiments of the above aspects may include one or more of the following features. The various spheroidized particles, processes used to create the spheroidized particles, and methods of producing metal or metal alloy powders in accordance with the present technology can provide a number of advantages. For example, the particles, processes for forming the particles and methods disclosed herein can be used in a continuous process that spheroidizes, and allows for control over the final microstructure of the particles. Such embodiments can reduce the cost of spheroidizing metal powders by reducing the number of processing steps, which in turn, reduces the energy per unit volume of processed material and can increase the consistency of the final product. Reduction in the number of processing steps also reduces the possibility for contamination by oxygen and other contaminants. Additionally, the continuous processes disclosed herein improve the consistency of the end products by reducing or eliminating variations associated with typical batch-based processing of particles. The present technology can achieve additional improvements in consistency due to the homogeneity and control of the energy source (i.e., plasma process). Specifically, if the plasma conditions are well controlled, particle agglomeration can be reduced, if not totally eliminated, thus leading to a better particle size distribution (on the same scale as the original feed materials).

In addition to the advantage of consistent end product, the present methods and resulting powders have the advantage of control and the ability to tailor the microstructure of the end product. While not wishing to be bound by theory, it is believed that the methods disclosed herein provide control over heating and cooling processing conditions. As a result, by controlling and, in some embodiments, monitoring, at least one cooling processing variable (e.g., cooling gas flow rate, residence time in cooling gas, and composition of cooling gas) a desired microstructure, which may be different from the original microstructure can be obtained. Further, novel multiphase microstructures can be created. That is, spheroidal particles can be processed by controlling heating and/or cooling conditions to create a core with one microstructure and a shell with a different microstructure. Some embodiments have the advantage of being able to modify or change the microstructure of the feed stock material to a desired microstructure, which may be a single phase or multiphase material.

Additional features and advantages are realized through the techniques of the present technology. The recitation herein of desirable objects or aspects which are met by various embodiments of the present technology is not meant to imply or suggest that any or all of these objects or aspects are present as essential features, either individually or collectively, in the most general embodiment of the present technology or in any of its more specific embodiments.

BRIEF DESCRIPTION OF THE DRAWINGS

The features and advantages of the present disclosure will be more fully understood from the following description of exemplary embodiments when read together with the accompanying drawings, in which.

DETAILED DESCRIPTION

Figure 1:
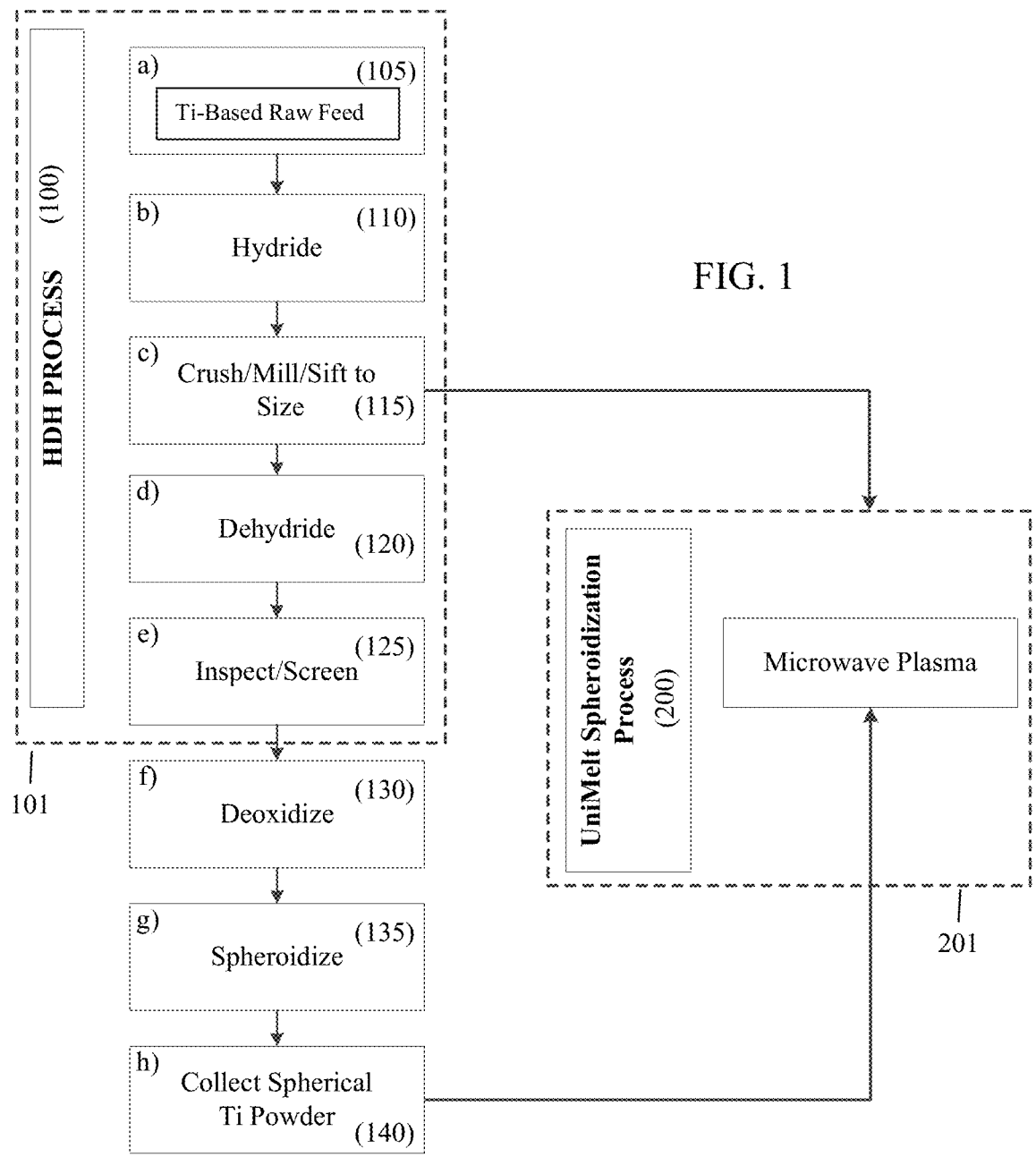
FIG. 1 illustrates an example method of producing spheroidal metallic and metallic alloy particles according to the present disclosure, compared against a conventional method for producing similar particles.

One aspect of the present disclosure involves a process of spheroidization of metals and metal alloy hydrides using a microwave generated plasma. The process uses readily available existing pre-screened or non-prescreened raw materials made of metal hydrides as feedstock. The powder feedstock is entrained in inert and/or reducing and/or oxidizing gas environment and injected into the microwave plasma environment. Upon injection into a hot plasma, the feedstock is simultaneously dehydrogenated and spheroidized and released into a chamber filled with an inert gas and directed into hermetically sealed drums where is it stored. This process can be carried out at atmospheric pressure, in a partial vacuum, or at a slightly higher pressure than atmospheric pressure. In alternative embodiments, the process can be carried out in a low, medium, or high vacuum environment. The process can run continuously and the drums are replaced as they fill up with spheroidized dehydrogenated and deoxidized metal or metal alloy particles. The process not only spheroidizes the powders, but also eliminates the dehydrogenation steps from the traditional process of manufacturing metal and metal alloy powders using Hydride-De-hydride (HDH) process, which leads to cost reduction. By reducing the number of processing steps and providing a continuous process, the possibilities for contamination of the material by oxygen and other contaminants is reduced. Furthermore, provided the homogeneity of the microwave plasma process, particle agglomeration is also reduced, if not totally eliminated, thus leading to at least maintaining the particle size distribution of the original hydride feed materials.

In the powdered metallurgy industry, the Hydride-Dehydride (HDH) process is used to resize large metallic or metallic alloy pieces down to a finer particle size distribution through crushing, milling, and screening. Metal and alloy powders are manufactured using the HDH process, where bulk feedstock, such as coarse metal powders or metal/metal alloy scraps, etc., are heated in a hydrogen-containing atmosphere at high temperature (~700° C.) for a few days. This leads to the formation of a brittle metal hydride, which can readily be crushed into a fine power and sifted to yield a desired size distribution determined by the end user. To be useful in powdered metallurgy, hydrogen must be dissociated and removed from the metal by heating the metal hydride powder within vacuum for a period of time. The dehydrogenated powder must then be sifted to remove large particle agglomerations generated during process due to sintering. The typical resulting powder particles have an irregular or angular shape. The powder is submitted to a deoxidation process to remove any oxygen picked up by the powder during sifting and handling. Conventional HDH processes produce only coarse and irregular shaped particles. Such HDH processes must be followed by a spheroidization process to make these particles spheroidal.

Conventional HDH processes are primarily carried out as solid-state batch processes. Typically, a volume of metal powder is loaded into a crucible(s) within a vacuum furnace. The furnace is pumped down to a partial vacuum and is repeatedly purged with inert gas to eliminate the presence of undesired oxygen. Diffusion of the inert gas through the open space between the powder particles is slow making it difficult to fully eliminate oxygen, which otherwise contaminates the final product. Mechanical agitation may be used to churn powder allowing for more complete removal of oxygen. However, this increases the complexity of the system and the mechanical components require regular maintenance, ultimately increasing cost.

Following oxygen purging the, hydrogenation may begin. The furnace is filled with hydrogen gas and heated up to a few days at high temperature to fully form the metal hydride.

The brittle nature of the metal hydride allows the bulk material to be crushed into fine powders which are then screened into desired size distributions.

The next step is dehydrogenation. The screen hydride powder is loaded into the vacuum furnace then heated under partial vacuum, promoting dissociation of hydrogen from the metal hydride to form $H_2$ gas and dehydrided metal. Dehydrogenation is rapid on the particle surface where $H_2$ can readily leave the particles. However, within the bulk of the powder, $H_2$ must diffuse through the bulk of the solid before it reaches surface and leave the particle. Diffusion through the bulk is a rate-limiting process "bottle-neck" requiring relatively long reaction time for complete dehydrogenation. The time and processing temperatures required for dehydrogenation are sufficient to cause sintering between particles, which results in the formation of large particle agglomerations in the final product. Post-process sifting eliminates the agglomerations, which adds process time and cost to the final product. Before the powder can be removed from the furnace, it must be sufficiently cooled to maintain safety and limit contamination. The thermal mass of the large furnaces may take many hours to sufficiently cool. The cooled powders must then be spheroidized in a separate machine. Generally this is carried out within an RF plasma, which are known to exhibit large temperature gradients resulting in partially spheroidized products.

Techniques are disclosed herein for manufacturing spheroidal metal and metal alloy powder products in a continuous process that simultaneously dehydrogenates and spheroidizes feed materials. According to exemplary embodiments, the dehydrogenation and spheroidization steps of an HDH process can be simplified to a single processing step using a microwave generated plasma. Such embodiments can reduce the cost of spheroidizing metal powders by reducing the number of processing steps, reducing the energy per unit volume of processed material, and increasing the consistency of the final product. Reduction in the number of processing steps also reduces the possibility for powder contamination by oxygen and other contaminants. Additionally, the continuous dehydrogenation processes disclosed herein improves the consistency of the end products by reducing or eliminating variations associated with typical batch-based dehydrogenation processes.

The rate of cooling of the dehydrogenated, deoxidized, and spheroidized metal and metal alloys can be controlled to strategically influence the microstructure of the powder. For example, rapid cooling of α-phase titanium alloys facilitates an acicular (martensite) structure. Moderate cooling rates produce a Widmanstätten microstructure, and slow cooling rates form an equiaxed microstructure. By controlling the process parameters such as cooling gas flow rate, residence time, cooling gas composition etc., microstructure of the metal and metal alloys can be controlled. In general, process parameters such as power density, flow rates, and residence time of the powder in the plasma dependent on the powder material's physical characteristics, such as, for example, the melting point, thermal conductivity, and particle size distribution. In some embodiments, the power density can range from about 20 W/cm$^3$ to 500 W/cm$^3$. In certain embodiments, the total gas flow rate can range from about 0.1 cfm (cubic feet per minute) to 50 cfm. In embodiments, the residence time can be tuned from about 1 milliseconds to 10 seconds. The precise cooling rates required to form these structures is largely a function of the type and quantity of the alloying elements within the material.

The rate of cooling, especially when combined with the consistent and uniform heating capabilities of a microwave plasma plume, allow for control over the final microstructure. As a result, the above methods can be applied to processing metal (e.g., titanium and titanium alloys such as Ti 6-4) feed stock. In particular, while certain methods herein have described the use of a metal hydride feed stock, the control over microstructure is not limited thereto. In particular, methods of the present technology and powders created by the present technology include the use of non-hydrided sources. For example, titanium metal and various titanium metal alloys can be utilized as the feed stock source. These materials can be crushed or milled to create particles for treatment within a microwave plasma torch.

Cooling processing parameters include, but are not limited to, cooling gas flow rate, residence time of the spheroidized particles in the hot zone, and the composition or make of the cooling gas. For example, the cooling rate or quenching rate of the particles can be increased by increasing the rate of flow of the cooling gas. The faster the cooling gas is flowed past the spheroidized particles exiting the plasma, the higher the quenching rate-thereby allowing certain desired microstructures to be locked-in. Residence time of the particles within the hot zone of the plasma can also be adjusted to provide control over the resulting microstructure. That is, the length of time the particles are exposed to the plasma determines the extent of melting of the particle (i.e., surface of the particle melted as compared to the inner most portion or core of the particle). Consequently, the extent of melting effects the extent of cooling needed for solidification and thus it is a cooling process parameter. Microstructural changes can be incorporated throughout the entire particle or just a portion thereof depending upon the extent of particle melting. Residence time can be adjusted by adjusting such operating variables of particle injection rate and flow rate (and conditions, such as laminar flow or turbulent flow) within the hot zone. Equipment changes can also be used to adjust residence time. For example, residence time can be adjusted by changing the cross-sectional area of the hot zone. For instance, for the same gas flow rates, a larger cross-sectional area of the plasma torch and/or extension tube in an afterglow region (e.g., region about plasma 11 in FIG. 4, the cross-sectional area being at least partially defined by the inner wall) will lead to a lower particle velocity, whereas a smaller cross-sectional area will lead to a higher velocity, thus lowering residence time in the hot zone.

Another cooling processing parameter that can be varied or controlled is the composition of the cooling gas. Certain cooling gases are more thermally conductive than others. For example helium is considered to be a highly thermally conductive gas. The higher the thermal conductivity of the cooling gas, the faster the spheriodized particles can be cooled/quenched. By controlling the composition of the cooling gas (e.g., controlling the quantity or ratio of high thermally conductive gasses, such as helium, to lesser thermally conductive gases, such as argon) the cooling rate can be controlled.

As is known in metallurgy, the microstructure of a metal is determined by the composition of the metal and heating and cooling/quenching of the material. In the present technology, by selecting (or knowing) the composition of the feed stock material, and then exposing the feed stock to a plasma that has the uniform temperature profile and control there over as provided by the microwave plasma torch, followed by selecting and controlling the cooling parameters control over the microstructure of the spheroidized metallic particle is achieved. In addition, the phase of the metallic material depends upon the compositions of the feed stock material (e.g., purity, composition of alloying elements, etc.) as well thermal processing. Titanium has two distinct phases known as the alpha phase (which has a hexagonal close packed crystal structure) and a beta phase which has a body centered cubic structure. Titanium can also have a mixed α+β phase. The different crystal structures yield different mechanical responses. Because titanium is allotropic it can be heat treated to yield specific contents of alpha and beta phases. The desired microstructure is not only a description of the grains (e.g., martensitic vs. equiaxed) but also the amount and location of different phases throughout.

In one exemplary embodiment, inert gas is continually purged surrounding a powdered metal feed to remove oxygen within a powder-feed hopper. A continuous volume of powder feed is then entrained within an inert gas and fed into the microwave generated plasma for dehydrogenation or for composition/maintaining purity of the spheroidized particles. In one example, the microwave generated plasma may be generated using a microwave plasma torch, as described in U.S. Patent Publication No. US 2013/0270261, and/or U.S. Patent Publication No. US 2008/0173641 (issued as U.S. Pat. No. 8,748,785), each of which is hereby incorporated by reference in its entirety. In some embodiments, the particles are exposed to a uniform temperature profile at between 4,000 and 8,000 K within the microwave generated plasma. Within the plasma torch, the powder particles are rapidly heated and melted. Liquid convection accelerates $H_2$ diffusion throughout the melted particle, continuously bringing hydrogen ($H_2$) to the surface of the liquid metal hydride where it leaves the particle, reducing the time each particle is required to be within the process environment relative to bulk processes. As the particles within the process are entrained within an inert gas, such as argon, generally contact between particles is minimal, greatly reducing the occurrence of particle agglomeration. The need for post-process sifting is thus greatly reduced or eliminated, and the resulting particle size distribution could be practically the same as the particle size distribution of the input feed materials. In exemplary embodiments, the particle size distribution of the feed materials is maintained in the end products.

Within the plasma, the melted metals are inherently spheroidized due to liquid surface tension. As the microwave generated plasma exhibits a substantially uniform temperature profile, more than 90% spheroidization of particles could be achieved (e.g., 91%, 93%, 95%, 97%, 99%, 100%), eliminating the need for separate dehydrogenation steps. In embodiments, which do not include dehydrogenation, both spheroidization and tailoring (e.g., changing, manipulating, controlling) microstructure are addressed or, in some instances, partially controlled, by treating with the microwave generated plasma. After exiting the plasma, the particles are cooled before entering collection bins. When the collection bins fill, they can be removed and replaced with an empty bin as needed without stopping the process.

Embodiments of the present disclosure are directed to producing particles that are substantially spherical or spheroidal or have undergone significant spheroidization. In some embodiments, spherical, spheroidal or spheroidized particles refer to particles having a sphericity greater than a certain threshold. Particle sphericity can be calculated by calculating the surface area of a sphere $A_{s,ideal}$ with a volume matching that of the particle, $V$ using the following equation:

$$r_{ideal} = \sqrt[3]{\frac{3V}{4\pi}}$$

$$A_{s,ideal} = 4\pi r_{ideal}^2$$

and then comparing that idealized surface area with the measured surface area of the particle, $A_{s,actual}$:

$$\text{Sphericity} = \frac{A_{s,ideal}}{A_{s,actual}}$$

In some embodiments, particles can have a sphericity of greater than 0.5, 0.6, 0.7, 0.75, 0.8, 0.9, 0.91, 0.95, or 0.99 (or greater than about 0.5, about 0.6, about 0.7, about 0.75, about 0.8, about 0.8, about 0.91, about 0.95, or about 0.99). In some embodiments, particles can have a sphericity of 0.75 or greater or 0.91 or greater (or about 0.75 or greater or about 0.91 or greater). In some embodiments, particles can have a sphericity of less than 0.5, 0.6, 0.7, 0.75, 0.8, 0.9, 0.91, 0.95, or 0.99 (or less than about 0.5, about 0.6, about 0.7, about 0.75, about 0.8, about 0.8, about 0.91, about 0.95, or about 0.99). In some embodiments, a particle is considered to be spherical, spheroidal or spheroidized if it has a sphericity at or above any of the aforementioned sphericity values, and in some preferred embodiments, a particle is considered to be spherical if its sphericity is at or about 0.75 or greater or at or about 0.91 or greater.

In some embodiments, a median sphericity of all particles within a given powder can be greater than 0.5, 0.6, 0.7, 0.75, 0.8, 0.9, 0.91, 0.95, or 0.99 (or greater than about 0.5, about 0.6, about 0.7, about 0.75, about 0.8, about 0.8, about 0.91, about 0.95, or about 0.99). In some embodiments, a median sphericity of all particles within a given powder can be less than 0.5, 0.6, 0.7, 0.75, 0.8, 0.9, 0.91, 0.95, or 0.99 (or less than about 0.5, about 0.6, about 0.7, about 0.75, about 0.8, about 0.8, about 0.91, about 0.95, or about 0.99). In some embodiments, a powder is considered to be spheroidized if all or a threshold percentage (as described by any of the fractions below) of the particles measured for the given powder have a median sphericity greater than or equal to any of the aforementioned sphericity values, and in some preferred embodiments, a powder is considered to be spheroidized if all or a threshold percentage of the particles have a median sphericity at or about 0.75 or greater or at or about 0.91 or greater.

In some embodiments, the fraction of particles within a powder that can be above a given sphericity threshold, such as described above, can be greater than 50%, 60%, 70%, 80%, 90%, 95%, or 99% (or greater than about 50%, about 60%, about 70%, about 80%, about 90%, about 95%, or about 99%). In some embodiments, the fraction of particles within a powder that can be above a given sphericity threshold, such as described above, can be less than 50%, 60%, 70%, 80%, 90%, 95%, or 99% (or less than about 50%, about 60%, about 70%, about 80%, about 90%, about 95%, or about 99%).

Particle size distribution and sphericity may be determined by any suitable known technique such as by SEM, optical microscopy, dynamic light scattering, laser diffraction, manual measurement of dimensions using an image analysis software, for example from about 15-30 measures per image over at least three images of the same material section or sample, and any other techniques.

Referring to FIG. 1, shown is a comparison of a conventional process for producing spheroidized titanium powder (100) versus a method (200) in accordance with the present technology. The process flow (101) on the left of FIG. 1 presents an example process that combines a HDH process (100) with spheroidization of titanium powders. The process starts with Ti raw material (step a, 105) that is hydrogenated (step b, 110), and then crushed and sifted to size (step c, 115). Pure titanium is recovered through dehydrogenation (step d, 120). It is then screened for agglomerations and impurities, and then sifted to the size specified by the customer (step e, 125). The powder then goes through a deoxidation step to reduce or eliminate oxygen that it picked up during the sifting and screening processes. Deoxidation is required especially for small particle sizes, such as particles below 50 microns, where the surface to volume ratio is substantial (step f, 130). The titanium particles are then spheroidized (step g, 135) and collected (step h, 140). A similar process can be used to create a Ti alloy, such as Ti 6-4, instead of pure titanium powder.

As discussed above, some embodiments of the present disclosure combine the dehydrogenation and spheroidization steps shown on the left side of FIG. 1 (101, 130, 135) in favor of a single step to produce spheroidized metals and/or metal alloys from corresponding hydride feedstock. An example of this technique is illustrated in the process flow (201) shown on the right side of FIG. 1. The method starts with a crushed and sifted metal hydride feed material (i.e., step c, 115, without performing the dehydride step). In this particular embodiment, the feed material is a titanium hydride powder, and the powder resulting from process 200 is a spherical titanium powder. (It is noted that process 200 can also be used with crushed and sifted metal alloy hydride feed material, such as titanium alloy hydride feed material, and the powder resulting from completion of process 200 is a spherical metal alloy powder, such as a spherical titanium alloy powder.) The powder is entrained within an inert gas and injected into a microwave generated plasma environment exhibiting a substantially uniform temperature profile between approximately 4,000 K and 8,000 K and under a partial vacuum. The hermetically sealed chamber process can also run at atmospheric pressure or slightly above atmospheric pressure to eliminate any possibility for atmospheric oxygen to leak into the process. The particles are simultaneously melted and dehydrogenated in the plasma, spheroidized due to liquid surface tension, re-solidifying after exiting the plasma (200). The particles are then collected in sealed drums in an inert atmosphere (140). Within the plasma, the powder particles are heated sufficiently to melt and cause convection of the liquid metal, causing dissociation of the hydrogen according to the reversible reaction where M=an arbitrary metal:

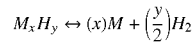

$$M_xH_y \leftrightarrow (x)M + \left(\frac{y}{2}\right)H_2$$

Within the partial vacuum, dissociation of hydrogen from the metal to form hydrogen gas is favored, driving the above reaction to the right. The rate of dissociation of hydrogen from the liquid metal is rapid, due to convection, which continually introduces $H_2$ to the liquid surface where it can rapidly leave the particle.

Figure 2:
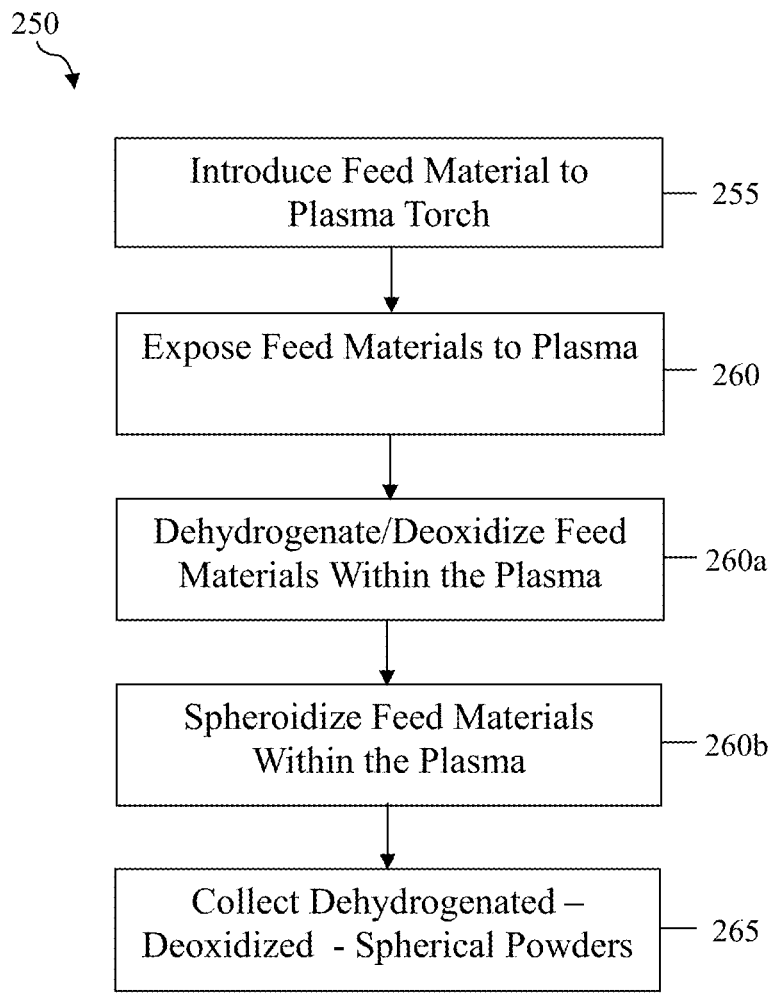
FIG. 2 illustrates another example method of producing dehydrogenated spheroidal particles according to the present disclosure.

FIG. 2 is a flow chart illustrating an exemplary method (250) for producing spherical powders, according to an embodiment of the present disclosure. In this embodiment, the process (250) begins by introducing a feed material into a plasma torch (255). In some embodiments, the plasma torch is a microwave generated plasma torch or an RF plasma torch. Within the plasma torch, the feed materials are exposed to a plasma causing the materials to melt, as described above (260). During the same time (i.e., time that feed material is exposed to plasma), hydrogen within the feed material dissociates from the metal, resulting in dehydrogenation (260a). Simultaneously the melted materials are spheroidized by surface tension, as discussed above (260b). Note that the step 260 includes 260a and 260b. That is, by exposing the feed material to the plasma both dehydrogenation and spheroidization are achieved; no separate or distinct processing steps are needed to achieve dehydrogenation and spheroidization. After exiting the plasma, the products cool and solidify, locking in the spherical shape and are then collected (265).

Figure 3:
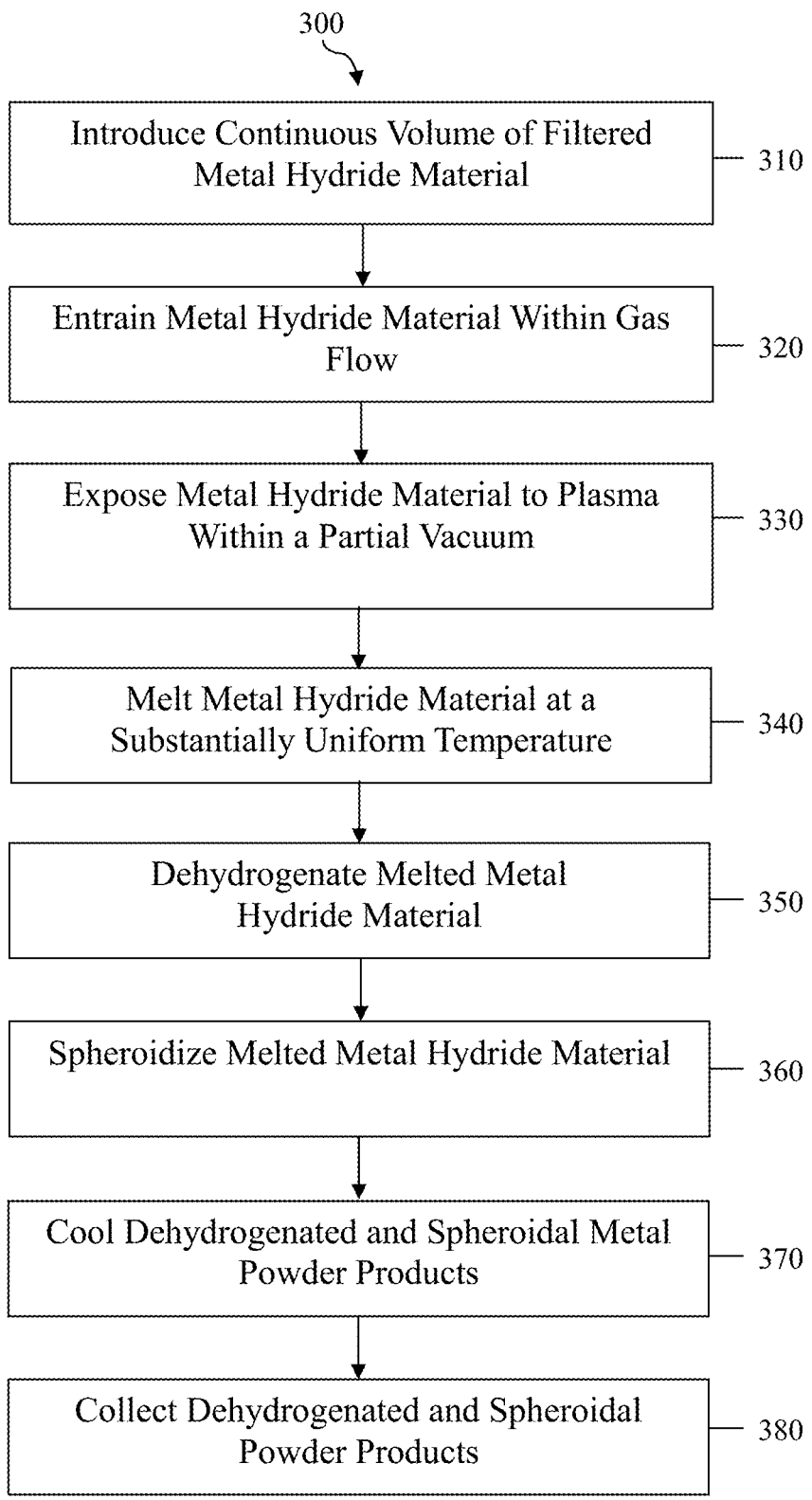
FIG. 3 illustrates another example method of producing dehydrogenated spheroidal particles from metal hydride material according to the present disclosure.

FIG. 3 is a flow chart illustrating another exemplary method (300) for producing spherical powders, according to another embodiment of the present disclosure. In this example, the method (300) begins by introducing a substantially continuous volume of filtered metal hydride feed materials into a plasma torch. As discussed above, the plasma torch can be a microwave generated plasma or an RF plasma torch (310). In one example embodiment, an AT-1200 rotating powder feeder (available from Thermach Inc.) allows a good control of the feed rate of the powder. In an alternative embodiment, the powder can be fed into the plasma using other suitable means, such as a fluidized bed feeder. The feed materials may be introduced at a constant rate, and the rate may be adjusted such that particles do not agglomerate during subsequent processing steps. In another exemplary embodiment, the feed materials to be processed are first sifted and classified according to their diameters, with a minimum diameter of 1 micrometers (μm) and a maximum diameter of 22 μm, or a minimum of 22 μm and a maximum of 44 μm, or a minimum of 44 μm and a maximum of 70 μm, or a minimum of 70 μm and a maximum of 106 μm, or a minimum of 106 μm and a maximum of 300 μm. As will be appreciated, these upper and lower values are provided for illustrative purposes only, and alternative size distribution values may be used in other embodiments. This eliminates recirculation of light particles above the hot zone of the plasma and also ensures that the process energy present in the plasma is sufficient to melt the particles without vaporization. Pre-screening allows efficient allocation of microwave power necessary to melt the particles without vaporizing material.

Once introduced into the microwave plasma torch, the feed materials can be entrained within an axis-symmetric laminar and/or turbulent flow toward a microwave or RF generated plasma (320). In exemplary embodiments, each particle within the process is entrained within an inert gas, such as argon. In some embodiments, the metal hydride materials are exposed to a partial vacuum within the plasma (330).

Within the plasma, the feed materials are exposed to a substantially uniform temperature profile and are melted (340). In one example, the feed materials are exposed to a uniform temperature profile of approximately between 4,000 and 8,000 K within the plasma. Melting the feed materials within the plasma brings hydrogen to the surface of the liquid metal hydride where it can leave the particle, thus rapidly dehydrogenating the particles (350). The $H_2$ acts as a reducing agent, which may simultaneously deoxidize the metal. Surface tension of the liquid metal shapes each particle into a spherical geometry (360). Thus, dehydrogenated and spherical liquid metal particles are produced, which cool and solidify into dehydrogenated and spherical metal powder products upon exiting the plasma (370). These particles can then be collected into bins (380). In some embodiments, the environment and/or sealing requirements of the bins are carefully controlled. That is, to prevent contamination or potential oxidation of the powders, the environment and or seals of the bins are tailored to the application. In one embodiment, the bins are under a vacuum. In one embodiment, the bins are hermetically sealed after being filled with powder generated in accordance with the present technology. In one embodiment, the bins are back filled with an inert gas, such as, for example argon. Because of the continuous nature of the process, once a bin is filled, it can be removed and replaced with an empty bin as needed without stopping the plasma process.

The methods and processes in accordance with the invention (e.g., 200, 250, 300) can be used to make spherical metal powders or spherical metal alloy powders. For example, if the starting feed material is a titanium hydride material, the resulting powder will be a spherical titanium powder. If the starting feed material is a titanium alloy hydride material, the resulting powder will be a spherical titanium alloy powder. In one embodiment that features the use of a starting titanium alloy hydride material, the resulting spherical titanium alloy powder comprises spherioidized particles of Ti Al6-V4, with between 4% to 7% weight aluminum (e.g., 5.5 to 6.5% Al) and 3% to 5% weight vanadium (e.g., 3.5 to 4.5% vanadium).

Figure 4:
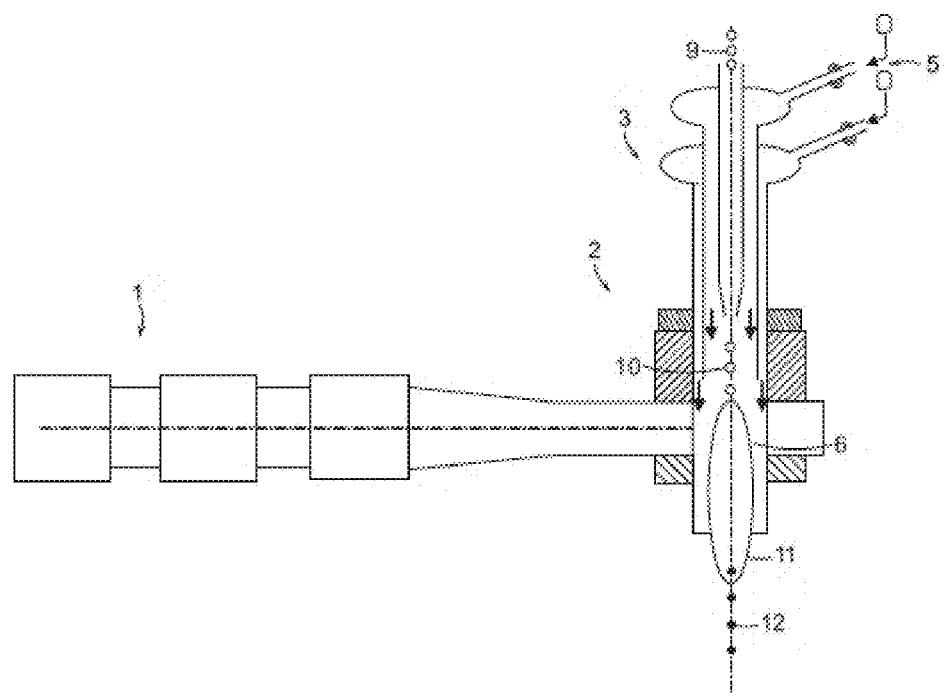
FIG. 4 illustrates an exemplary microwave plasma torch that can be used in the production of spheroidal and dehydrogenated metal or metal alloy powders, according to embodiments of the present disclosure.

FIG. 4 illustrates an exemplary microwave plasma torch that can be used in the production of spheroidal and dehydrogenated metal or metal alloy powders, according to embodiments of the present disclosure. As discussed above, metal hydride feed materials 9, 10 can be introduced into a microwave plasma torch 3, which sustains a microwave generated plasma 11. In one example embodiment, an entrainment gas flow and a sheath flow (downward arrows) may be injected through inlets 5 to create flow conditions within the plasma torch prior to ignition of the plasma 11 via microwave radiation source 1. In some embodiments, the entrainment flow and sheath flow are both axis-symmetric and laminar, while in other embodiments the gas flows are swirling. The feed materials 9 are introduced axially into the microwave plasma torch, where they are entrained by a gas flow that directs the materials toward the plasma. As discussed above, the gas flows can consist of a noble gas column of the periodic table, such as helium, neon, argon, etc. Within the microwave generated plasma, the feed materials are melted, as discussed above, in order to dehydrogenate and spheroidize the materials. Inlets 5 can be used to introduce process gases to entrain and accelerate particles 9, 10 along axis 12 towards plasma 11. First, particles 9 are accelerated by entrainment using a core laminar gas flow (upper set of arrows) created through an annular gap within the plasma torch. A second laminar flow (lower set of arrows) can be created through a second annular gap to provide laminar sheathing for the inside wall of dielectric torch 3 to protect it from melting due to heat radiation from plasma 11. In exemplary embodiments, the laminar flows direct particles 9, 10 toward the plasma 11 along a path as close as possible to axis 12, exposing them to a substantially uniform temperature within the plasma. In some embodiments, suitable flow conditions are present to keep particles 10 from reaching the inner wall of the plasma torch 3 where plasma attachment could take place. Particles 9, 10 are guided by the gas flows towards microwave plasma 11 were each undergoes homogeneous thermal treatment. Various parameters of the microwave generated plasma, as well as particle parameters, may be adjusted in order to achieve desired results. These parameters may include microwave power, feed material size, feed material insertion rate, gas flow rates, plasma temperature, residence time and cooling rates. In some embodiments, the cooling or quenching rate is not less than $10^{+3}$ degrees C./sec upon exiting plasma 11. As discussed above, in this particular embodiment, the gas flows are laminar; however, in alternative embodiments, swirl flows or turbulent flows may be used to direct the feed materials toward the plasma.

Figure 5:
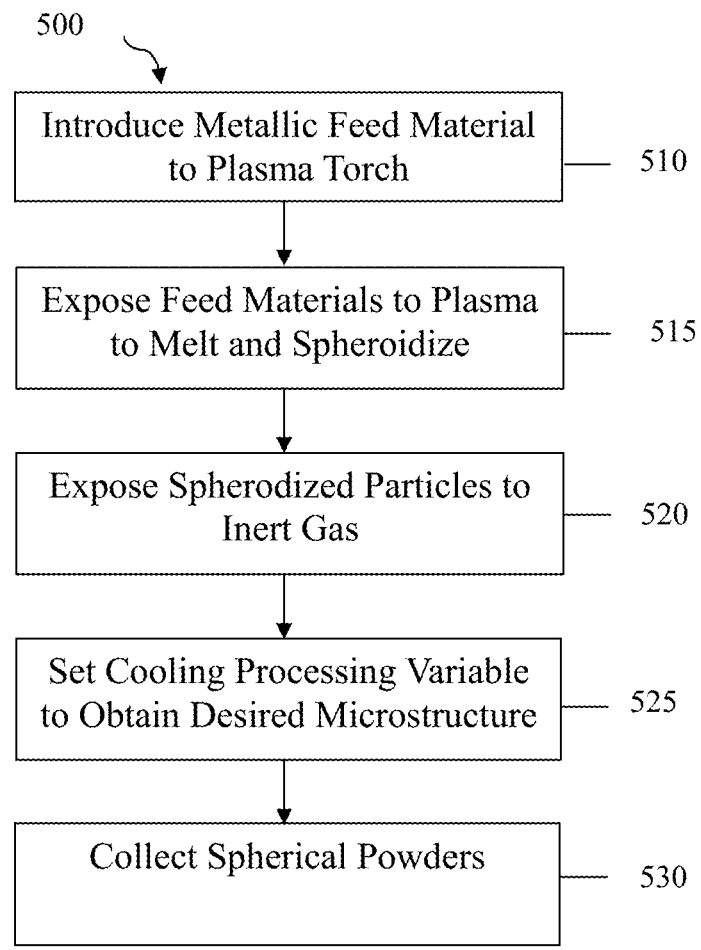
FIG. 5 illustrates an exemplary method of producing titanium based (e.g., titanium, titanium alloy) spheroidal particles having a desired microstructure.

FIG. 5 illustrates an exemplary method (500) of producing spheroidized titanium particles with a tailored or desired microstructure. Method 500 includes several processing steps to treat metallic feed materials such as, for example, titanium feed materials (e.g., titanium or titanium alloys) to create spheroidized metallic particles with a desired microstructure. In step 510, metallic (e.g., titanium based) feed materials comprising particles are feed into a plasma torch. The particles can be produced from crushing, pulverizing, or milling feed stock materials. In general, the feed stock particles have an average particle size of between 1 micron and 300 microns. In step 515, the feed stock particles are exposed to a microwave generated plasma to melt at least the surface portion of the particles. The melted portions of the particles allow for spheriodization of the particles. In step 520, the spheroidized particles are exposed to an inert gas such helium, nitrogen, argon or combinations/mixtures thereof. In step 525, the cooling processing variables/conditions are set and maintained to achieve a desired microstructure. For example, in embodiments in which a martensitic microstructure is desired throughout the entire particle, the cooling processing conditions are set for rapid cooling. As a result, the residence time of the particles in the hot zone is selected to allow for melting of the entire feedstock particle, the cooling gas flow rate is set to a fastest rate, and the amount of helium forming the composition of the cooling gas is set to a maximum available. After exposing the spheroidized particles to the selected cooling conditions, the spherical powders are collected in step 530.

Figure 6:
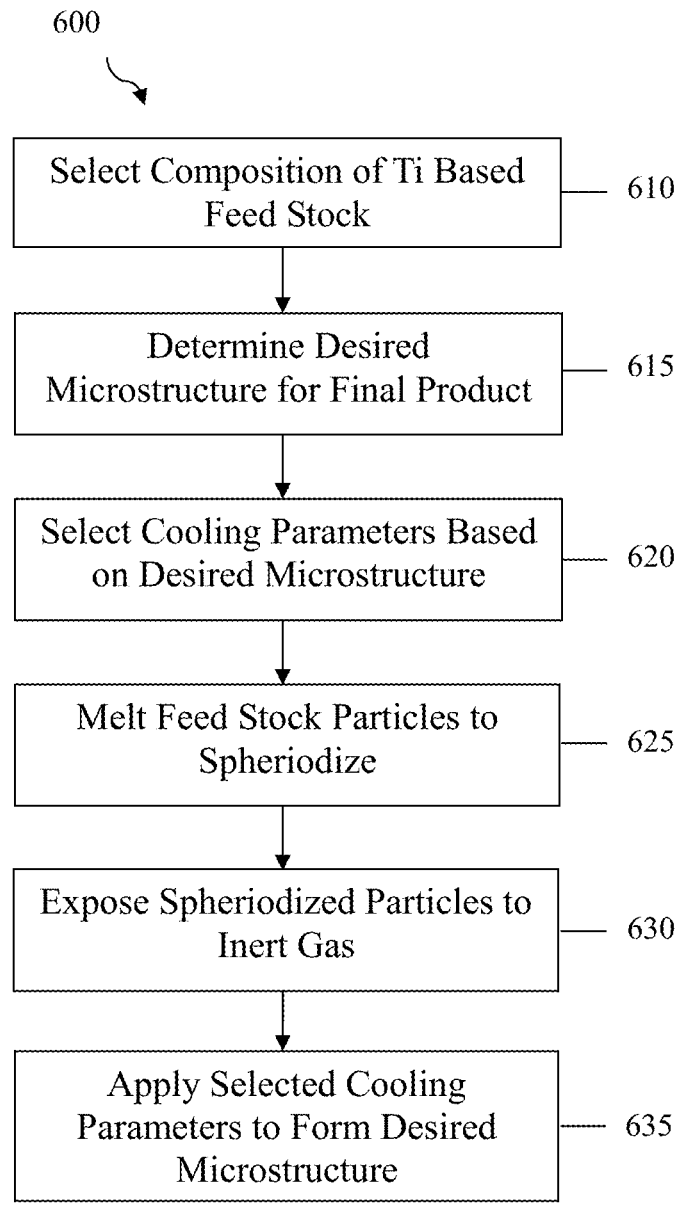
FIG. 6 illustrates an exemplary method of modifying a particle microstructure according to embodiments of the present disclosure.

FIG. 6 illustrates an exemplary method (600) of modifying metallic feed stock material to have a spheroidized shape and a desired microstructure. The method of 600 includes several processing steps to treat metallic feed materials such as, for example, titanium feed materials (e.g., titanium or titanium alloys) to create spheroidized metallic particles with a desired microstructure. In this method, knowledge of the chemical composition of the feed stock (e.g., 99.9% pure titanium, Ti-6Al-4V, etc.) is used in combination with control over thermal processing conditions to achieve spheroidal particles with a desired microstructure different than the metallic feed stock material. In step 610, the composition of the Ti-based feed stock material is selected or analyzed to determine its composition. In step 615, a desired microstructure of a final product is determined. For example, it may be determined that an α-phase 99% pure Ti equiaxed microstructure throughout the spheroidized particle is desired. As a result, a slower rate of cooling will be required than that used to produce a martensitic microstructure. Cooling processing parameters will be selected (step 620), such as cooling gas flow rate, residence time, and/or composition of cooling gas to achieve such a microstructure based upon the composition of the feed stock materials. In general, the microstructure of the final product will differ from the original feed stock material. That is an advantage of the present method is to be able to efficiently process feed materials to create spheroidized particles with a desired microstructure. After selecting or determining the cooling parameters, the feed stock particles are melted in the microwave generated plasma to spheriodize the particles in step 625. The spheroidized particles are exposed to an inert gas (step 630) and the determined or selected cooling parameters are applied to form the desired microstructure.

The desired microstructure of the spheroidized particle (end product) can be tailored to meet the demands and material characteristics of its use. For example, the desired microstructure may be one that provides improved ductility (generally associated with the α-phase). In another example, the desired microstructure may be associated with the inclusion of α+β phase or regions of α with islands of β phase or vice-versa. Without wishing to be bound by theory, it is believe that the methods of the present disclosure allow for control over the phase of the spheroidized particles as the microwave generated plasma has a uniform temperature profile, fine control over the hot zone, and the ability to select and adjust cooling processing parameters.

Figure 7:
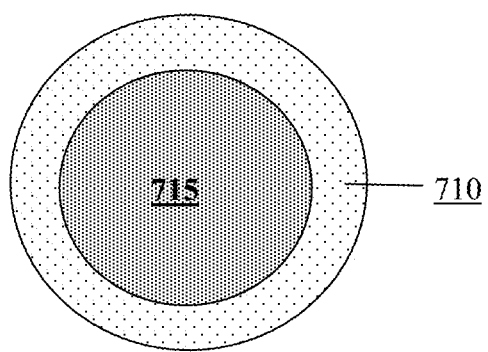
FIG. 7 illustrates an exemplary particle modified according to embodiments of the present disclosure.

Using the methods of the present technology, various microstructures, crystal structures and regions of differing microstructure and/or crystal structures can be produced. Accordingly, new spheroidal titanium particles can be produced efficiently. For example, due to the abilities to control the hot zone and cooling processing parameters, the present technology allows an operator to create multiple regions within the spheroidal particle. FIG. 7 shows such an embodiment. This figures illustrates a spheroidal particle which has two distinct regions. The outer or shell region 715 and an inner core 710. The original titanium feed material for this particle was a pure titanium α-phase powder. The feed material was exposed to the plasma under conditions (temperature, residence time, etc.) such that only a surface portion of the particle melted, so that spheriodization could occur. Cooling rates applied allowed for the transformation of the shell region to transform to β-phase, leaving the core to retain the α-phase.

In another embodiment, not shown, the entire feed stock particle can be melted and cooling parameters can be selected and applied to create a crystal structure that has the same phase as the feed stock material (e.g., retains α-phase) or is transformed to a new phase or mixture of phases. Similarly, cooling processing parameters can be selected and applied to create spheroidal particles that have the same microstructure throughout the particle or various microstructures in two or more regions (e.g., shell region, core region).

In describing exemplary embodiments, specific terminology is used for the sake of clarity and in some cases reference to a figure. For purposes of description, each specific term is intended to at least include all technical and functional equivalents that operate in a similar manner to accomplish a similar purpose. Additionally, in some instances where a particular exemplary embodiment includes a plurality of system elements, device components or method steps, those elements, components or steps may be replaced with a single element, component or step. Likewise, a single element, component or step may be replaced with a plurality of elements, components or steps that serve the same purpose. Moreover, while exemplary embodiments have been shown and described with references to particular embodiments thereof, those of ordinary skill in the art will understand that various substitutions and alterations in form and detail may be made therein without departing from the scope of the invention. Further still, other functions and advantages are also within the scope of the invention.

What is claimed is:

1. A method of modifying at least one of particle shape or microstructure of a titanium based feed stock, the method comprising:
    selecting a composition of the titanium based metal feed stock;
    determining a desired microstructure for a final product;
    selecting cooling process parameters based upon the desired microstructure and selected composition of the titanium based metal feed stock;
    melting at least a surface portion of particles of the titanium based metal feed stock in a plasma having a substantially uniform temperature profile at between 4,000K and 8,000K to spheroidize the particles;
    exposing the spheroidized particles to an inert gas; and
    setting and applying the selected cooling processing parameters to create spheroidized particles with the desired microstructure,
    wherein the cooling process parameters comprise one or more of a cooling gas flow rate, a residence time of the titanium based metal feed stock, and a cooling gas composition,
    wherein the titanium based metal feed stock has a α-phase crystal structure and the spheroidized particles includes one or more regions of a β-phase crystal structure.

2. The method of claim 1, wherein selecting the composition of the titanium based metal feed stock comprises determining an alloying composition of a titanium based feed stock source.

3. The method of claim 1, wherein the particles of the titanium based metal feed stock have a particle size of no less than 1.0 micrometers and no more than 300 micrometers.

4. The method of claim 1, wherein setting and applying the selected cooling processing parameters comprises controlling a cooling gas flow rate.

5. The method of claim 1, wherein setting and applying the selected cooling processing parameters comprises controlling a residence time of the particles of the titanium based metal feed stock in the plasma.

6. The method of claim 1, wherein setting and applying the selected cooling processing parameters comprises controlling a cooling gas composition.

7. The method of claim 1, wherein the cooling processing parameters are selected to create a martensitic microstructure in the spheroidized particles.

8. The method of claim 1, wherein the cooling processing parameters are selected to create a Widmanstätten microstructure in the spheroidized particles.

9. The method of claim 1, wherein the cooling processing parameters are selected to create an equiaxed microstructure in the spheroidized particles.

10. The method of claim 1, wherein the cooling processing parameters are selected to create at least two regions in the spheroidized particles, each region having a different microstructure or crystal structure.

11. The method of claim 10, wherein the at least two regions include a core portion and a skin portion.

12. The method of claim 11, wherein the skin portion has a microstructure that is different from the microstructure of the titanium based metal feed stock.

13. A method of modifying at least one of particle shape or microstructure of a titanium based feed stock, the method comprising:
    selecting a composition of the titanium based metal feed stock;
    determining a desired microstructure for a final product;

selecting cooling process parameters based upon the desired microstructure and selected composition of the titanium based metal feed stock;

melting at least a surface portion of particles of the titanium based metal feed stock in a plasma having a substantially uniform temperature profile at between 4,000K and 8,000K to spheroidize the particles;

exposing the spheroidized particles to an inert gas; and setting and applying the selected cooling processing parameters to create spheroidized particles with the desired microstructure, wherein the cooling process parameters comprise one or more of a cooling gas flow rate, a residence time of the titanium based metal feed stock, and a cooling gas composition, wherein the titanium based metal feed stock has a single phase structure and the spheroidized particles have a multiphase structure.

14. The method of claim 13, wherein selecting the composition of the titanium based metal feed stock comprises determining an alloying composition of a titanium based feed stock source.

15. The method of claim 13, wherein the particles of the titanium based metal feed stock have a particle size of no less than 1.0 micrometers and no more than 300 micrometers.

16. The method of claim 13, wherein setting and applying the selected cooling processing parameters comprises controlling a cooling gas flow rate.

17. The method of claim 13, wherein setting and applying the selected cooling processing parameters comprises controlling a residence time of the particles of the titanium based metal feed stock in the plasma.

18. The method of claim 13, wherein setting and applying the selected cooling processing parameters comprises controlling a cooling gas composition.

19. The method of claim 13, wherein the cooling processing parameters are selected to create a martensitic microstructure in the spheroidized particles.

20. The method of claim 13, wherein the cooling processing parameters are selected to create a Widmanstätten microstructure in the spheroidized particles.

21. The method of claim 13, wherein the cooling processing parameters are selected to create an equiaxed microstructure in the spheroidized particles.

22. The method of claim 13, wherein the cooling processing parameters are selected to create at least two regions in the spheroidized particles, each region having a different microstructure or crystal structure.

23. The method of claim 13, wherein the at least two regions include a core portion and a skin portion.

24. The method of claim 23, wherein the skin portion has a microstructure that is different from the microstructure of the titanium based metal feed stock.

* * * * *